BALANCED CHARGE TRANSFER CIRCUIT

Filed March 8, 1965 2 Sheets-Sheet 1

INVENTORS
PHILIP A. HOFFMAN
CHARLES W. BARBOUR
McKENNY W. EGERTON, JR
GERARD B. GILBERT, JR.
BY
LeBlanc and Shur
ATTORNEYS Sept. 23, 1969 P. A. HOFFMAN ET AL 3,469,255

BALANCED CHARGE TRANSFER CIRCUIT

Filed March 8, 1965 2 Sheets-Sheet 2

INVENTORS
PHILIP A HOFFMAN
CHARLES W BARBOUR
McKENNY W EGERTON, JR
GERARD B GILBERT, JR

BY
LeBlanc and Shur
ATTORNEYS

United States Patent Office 3,469,255

Patented Sept. 23, 1969

3,469,255
BALANCED CHARGE TRANSFER CIRCUIT

Philip A. Hoffman, Towson, Charles W. Barbour, Timonium, McKenny W. Egerton, Jr., Owings Mills, and Gerard B. Gilbert, Jr., Baltimore, Md., assignors, by mesne assignments, to The Bendix Corporation, a corporation of Delaware Filed Mar. 8, 1965, Ser. No. 437,948
Int. Cl. H04l *3/00*
U.S. Cl. 340—347 14 Claims

ABSTRACT OF THE DISCLOSURE

Disclosed is a balanced charge transfer circuit for use in capacitive charge transfer analog to digital converters and other circuits. The balanced transfer circuit comprises a pair of high gain amplifiers employing negative capacitive feedback with the output of one amplifier connected to the input of the other through a parallel resistor and capacitor. The balanced circuit substantially reduces the effects of stray capacitance on the transfer of charge.

This invention relates to charge transfer circuits and more particularly to a balanced transfer circuit for substantially reducing the effects of stray capacitance and other errors integrated by the transfer circuit.

The current integrating effect of a feedback capacitor coupled between the output and input of an amplifying stage has been known for many years and this capacitive coupling is referred to as producing the "Miller" effect. Miller effect type integrators for a wide variety of purposes, including sawtooth waveform generation, are disclosed in U.S. Patents Nos. 2,412,485 and 2,692,334. Similar circuits for transferring charge to a capacitor are shown in an article entitled "Long Term Analogue Memory," by L. Torn, S. Katz and R. Close, page 566, volume 10, Proceedings of the National Electronics Conference, 1954.

The present-day Miller effect integrator very often takes the form of either a single or multistage amplifier having a feedback capacitor connected in a feedback circuit between the input and the output in the manner of an operational amplifier. The amplifier itself may comprise one or more stages of either vacuum tubes or solid state devices and possesses an over-all high negative gain ideally approaching infinity. The feedback action of the amplifier is such that the input terminal of the amplifier is maintained at ground potential.

Although other transfer circuits have been developed and may be satisfactorily used for transferring substantially all of the electrical charge from a capacitor to a storage device (usually in the form of a memory capacitor), the capacitive feedback amplifier is particularly suited for this operation since the circuit is such that the amount of charge remaining on the first capacitor after charge transfer, i.e., the theoretical charge transfer error, is inversely proportional to the amplifier gain. Since present-day amplifiers may have gains literally in the thousands, it can be seen that the circuit may be used to transfer a charge so that the amount of charge remaining on the first capacitor is for all practical purposes negligible. Furthermore, because of the high gain, any variations in circuit parameters have very little effect on the transfer action of the circuit.

As pointed out above, the input node of the charge transfer amplifier is a virtual ground because of feedback around the amplifier. This fact greatly assists in minimizing extraneous coupling of signals. However, the output voltage of the amplifier does represent the integrated value of input currents to this node and errors may result because of extraneous coupling directly to the input node of the amplifier. These may be caused, for example, by leakage through the input switches or by AC coupling through the stray capacity across the terminals of the amplifier input switches, or by leakage currents into or out of the amplifier.

It is a feature of the present invention to reduce substantially the effect or stray capacitance at the input to the charge transfer amplifier by providing a simplified balancing circuit. The novel balanced charge transfer circuit of this invention may be used with both grounded and floating inputs. A substantial increase in common mode rejection is obtained. The balanced charge transfer circuit is particularly suited to analog sampling, to multiplex operation, and is also useful in charge transfer analog to digital and digital to analog converters.

It is therefore an object of the present invention to provide a novel charge transfer circuit.

Another object of the present invention is to provide an improved balanced charge transfer circuit.

Another object of the present invention is to provide a novel arrangement for substantially reducing the effects of stray capacity in a capacitive feedback type charge transfer circuit.

Another object of the present invention is to provide a balance circuit for reducing the effects of stray capacity at the input node to a charge transfer amplifier.

Another object of the present invention is to provide a novel A/D converter incorporating a balanced charge transfer circuit.

Another object of the present invention is to provide an analog to digital converter having a balanced capacitive feedback charge transfer circuit for eliminating the effects of stray capacity.

These and further objects and advantages of the invention will be more apparent upon reference to the following specification, claims and appended drawings, wherein:

Figures 1, 2, 3, 4, 5:
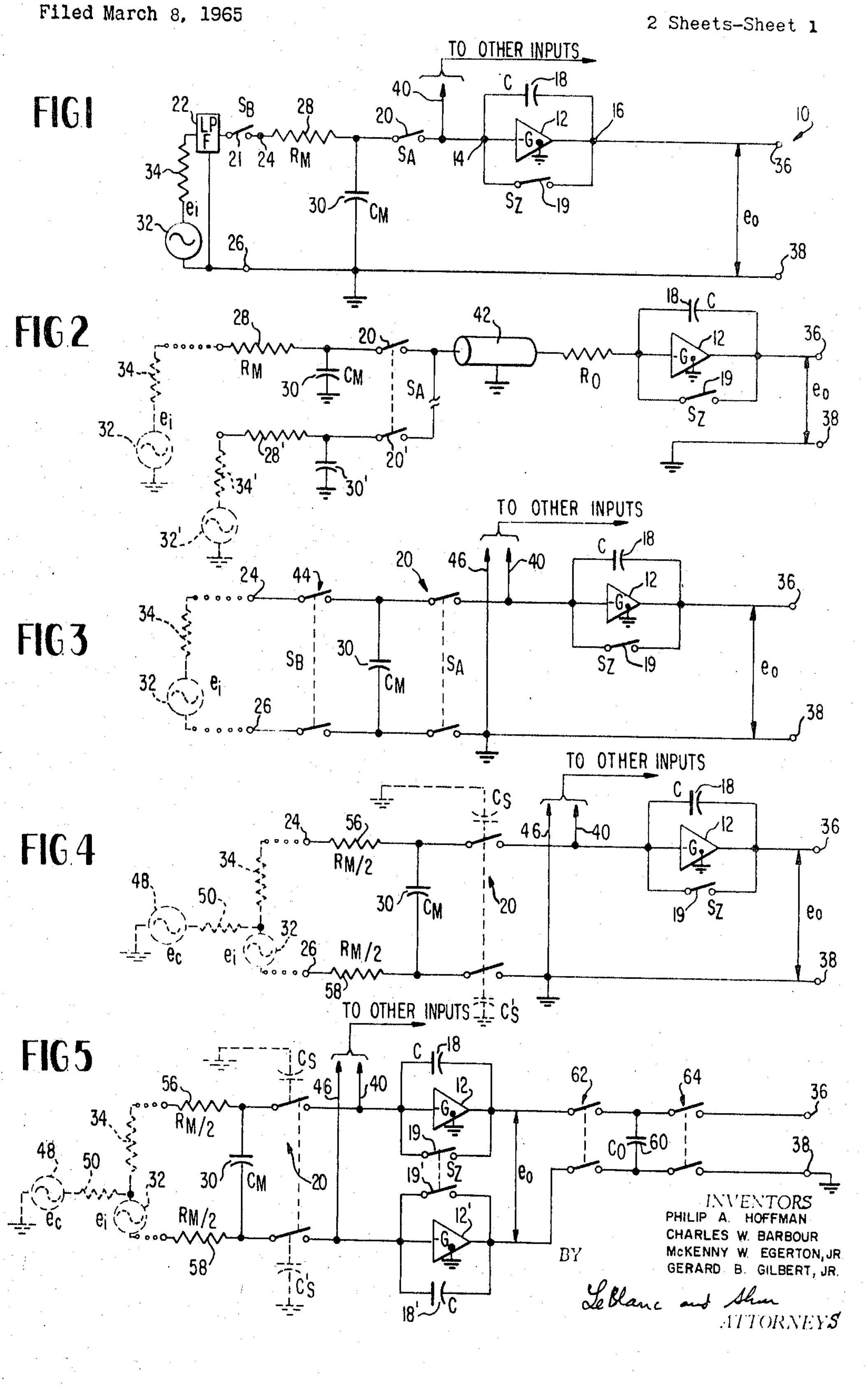
FIG. 1 is a circuit diagram of a capacitive feedback type charge transfer circuit useful for multiplex sampling.
FIG. 2 shows a similar circuit illustrating remote multiplexer operation.
FIG. 3 illustrates a similar circuit constructed for simultaneous multiplexer sampling.
FIG. 4 shows the circuit of a similar multiplexer arrangement for sampling floating input sources.
FIG. 5 is a circuit diagram of a first balanced charge transfer circuit for minimizing the effects of stray capacity.

Referring to the drawings, FIG. 1 illustrates generally at 10 a charge transfer circuit for use in a multiplier to sequentially sample a plurality of analog inputs. The charge transfer circuit comprises a high negative gain DC amplifier 12 having a negative gain ideally infinite. Connected between the input terminal 14 and the output terminal 16 of the amplifier is a feedback capacitor 18. Connected to the input terminal 14 is a sampling switch 20 labeled $S_A$.

A series resistor 28 labeled $R_M$ and a shunt sampling capacitor 30 labeled $C_M$ connect the sampling switch 20 to the input terminals 24 and 26 of the multiplexer. The lower end of the sampling capacitor 30 is grounded. A DC or slowly varying AC analog source 32 to be sampled having an internal resistance 34 is connected to the input terminals 24 and 26 through an external switch 21. An alternative sampling arrangement is to omit switch 21 and couple source 32 to the multiplexer through a pre-sampling filter indicated by the low pass filter 22. In this case resistor 28 and capacitor 30 may if desired form part of the filter. Other arrangements include the use of both switch 21 and filter 22 as shown or they both may be omitted and the source connected directly to input terminals 24 and 26. An output signal representative of the value of the various analog samples is developed across charge transfer circuit output terminals 36 and 38. Input terminal 14 of the amplifier is connected by a lead 40 through similar switch or switch and filter arrangements to the ungrounded side of the remaining analog signals to be sampled.

Multiplex is accomplished by sequentially sampling the charge on a capacitor $C_M$ similar to capacitor 30 associated with each analog input channel. These capacitors may be the terminating elements in a pre-sampling filter provided for each input. The sampling process is accomplished by very rapidly discharging the sampling capacitor into the input node of the amplifier 12 having capacitive feedback so that it serves as a charge accumulator capable of high speed operation.

Assuming switch 19 is closed and opened just before switch 20 operates and that transient conditions have decayed:

$$e_o \cong -e_i \frac{C_M}{C}$$

Thus, the charge transfer system provides an arrangement for voltage gain by making the ratio of $C_M$ to C greater than 1. Furthermore, the scale factor of an individual channel is controlled by an adjustment in the value of $C_M$.

The gain obtainable in the charge transfer process makes possible a highly flexible multiplexer system. Various input levels can be readily established on a channel-by-channel basis by simply choosing the appropriate value of sampling capacitor.

Lower level input signals can be multiplexed directly without channel amplifiers. The factors which limit lower level operation are principally switch bias errors and charge transfer amplifier bias errors. Switches are available with bias errors in the microvolt range for very small signals or with bias errors in the millivolt range for higher level work. Multiplexer cost is of course higher when low bias error switches are required. Similarly two choices are available in charge transfer amplifiers; one especially stabilized for very low bias errors, the other temperature compensated for more economical use in sampling of higher level signals. These properties are of course not exclusive since at greater cost it is possible to have a low bias error temperature compensated amplifier.

The impedance presented to the analog source by the multiplexer input circuit in general depends upon the specific application because it is influenced by voltage gain, sampling rate and pre-sampling filter requirements.

The low frequency input resistance is found to be the following:

$$R \cong \frac{1}{f_s C_M}$$

where $f_s$=channel sampling rate in cycles per second and $C_M$=value of sampling capacitor in farads. For typical values of $C_M$, the low frequency input resistance is approximately equal to $10^9$ divided by the channel sampling rate for high level multiplexing or $10^7$ divided by the sampling rate for low level multiplexing.

At frequencies approaching $f_s$, the AC input impedance of the multiplexer depends upon the sampling capacitor and the reactance of the pre-sampling filter and is approximately equal to the impedance of the pre-sampling filter. The more reactive elements in the filter the smaller is the effect of the switch on the AC input impedance.

The multiplexer system depends upon accurate charging or discharging of the capacitors during the time the switch operates. For example, $C_M$ must be substantially completely discharged during the charge transfer. This necessitates the use of switches with low saturation resistance and amplifiers with good transient response. For systems similar to FIG. 1 with $S_B$ removed the maximum encoding rate is limited by the time required to charge $C_M$. For a two switch system (FIG. 3), other than the switch closure times there is no time limit required for stabilization to take place. The maximum sampling rate is thus limited primarily by the maximum duty cycle capabilities of the switch. With the range of switch closure times available the multiplexer sampling rate is usually not the limiting factor, either the conversion rate or the output data rate more probably control the situation.

The sampling aperture of the standard units is dependent on the switch closure time. These times normally range from 0.25 microsecond to 20 microseconds although shorter or longer intervals are possible. The specific switch closure time is determined by the time that it takes to accurately discharge $C_M$, the sampling capacitor. That is:

$$t_c \cong KR_S C_M \cong |KR_s GC|$$

where $t_c$=switch closure time.

$R_s$=primarily switch saturation resistance, (total resistance of both poles in double pole switch) but also includes amplifier resistance.

G=voltage gain from input terminals to output of charge transfer amplifier, equal to $-C_M/C$.

C=value of storage capacitor on charge transfer amplifier.

K=proportionality constant which depends upon the desired system accuracy.

It may be noted that the aperture is proportional to the gain in the charge transfer process.

Special multiplexers can be provided using extra switches on each input to further reduce the effective sampling aperture. Effective apertures on the order of nanoseconds are obtainable using this system, however, additional restraints are imposed on the signal source characteristics.

A further advantage of the capacitive feedback type charge transfer circuit resides in its adaptability to remote multiplexer operation. Frequently, systems applications make it desirable to operate one or more multiplexers at remote locations with respect to an analog/digital converter. This type of operation has in the past been made awkward, if not impossible, by the practical problems involved in line matching and calibration stability. Using the system of the present invention it is readily possible to have remote operation without the complexity of impedance matching amplifiers. A block diagram illustrating the technique is shown in FIG. 2 where corresponding parts bear corresponding reference numerals. In FIG. 2 and the following figures the analog sources are shown as coupled to the sampling capacitor 30 by dotted lines to indicate the coupling may be either through a switch 21 or a low pass filter 22 as previously described. In that figure the additional analog sources to be sampled and multiplexed are given prime numbers corresponding to the similar elements of FIG. 1 but with the addition that the analog sources and pre-sampling filters (or external switches) along with switch 20 are separated from the operational amplifier 12 by a transmission line cable 42 having a characteristic impedance $R_0$.

In operation of the FIG. 2 circuit $C_M$ charges to $e_1$ during the time between samples. To sample this channel switch 20 is closed for a period somewhat less than twice the electrical length of the coaxial cable 42. This discharges $C_M$ into the characteristic impedance $R_0$ of the cable and if the system is properly proportioned, substantially all of the charge on $C_M$ flows into the cable. None of this charge can return to $C_M$ because the switch $S_A$ opens in less than a round trip time.

Ultimately all the charge must flow either into C (capacitor 18) or through the shunt conductance of the cable. Neglecting for the moment this cable loss, the voltage at the output of the amplifier 12 after equilibrium is established will be $$e_o \cong -e_1 \frac{C_M}{C}$$

Switch 19($S_z$) is used to discharge capacitor 18 before taking the next sample.

The loss involved in the shunt conductance of good cable is so small that it can be neglected for cable lengths less than several thousand feet. In the case of an impedance mismatch a percentage of the reflected wave arriving at the input node of the amplifier after each round trip will be integrated and a diminishing percentage will again be reflected on the next round trip. It is apparent that this error can be made to be insignificant by allowing enough reflections to take place for the charge to be completely integrated between the operation of the sampling switch $S_A$ and utilization of the output voltage, $e_o$. If the cable and $R_0$ are sufficiently well matched, the number of reflections will not exceed three or four for 10-bit accuracy. This type of system offers advantages with respect to equipment cost, installation flexibility, and reliability. Since no amplifiers are required at the multiplexer, it is possible to locate the multiplexer in unusually severe environments.

Another important advantage of the capacitive feedback type charge transfer circuit is the opportunity it offers for simultaneous sampling. This type of arrangement is illustrated in FIG. 3 with like parts bearing like reference numerals. In this arrangement switch 20 takes the form of a single throw double pole switch as illustrated in FIG. 3 and a second similar single throw double pole switch 44 is provided. Lead 40 and an additional lead 46 couple the amplifier 12 to other sources to be sampled as in the preceding embodiments. Simultaneous sampling as illustrated in FIG. 3 requires due consideration of input characteristics. It will be noticed that in general it follows the arrangement of FIG. 1. The system programming is modified to close all input switches 44 simultaneously. The sampling switches 20 are each closed in sequence to permit successive transfers to capacitor 18 of the input quantities. Switch 19 is of course closed after each transfer to discharge capacitor 18.

Although the description of the multiplexers has been based upon simple RC input circuits other configurations may be used.

A series inductance may be added to the RC filter circuit 22 with due consideration to damping. This inductance can reduce the charging time constant by as much as 1.5 to 1, thus providing for higher sampling rates. For the same sampling rate the addition of inductance makes possible a higher input impedance or smaller error.

Termination of filters by a sampling switch is quite valid and filter characteristics are entirely predictable in such applications. Passive pre-sampling filters having specific properties can be provided or active wave filters may be utilized for the low pass filter 22 if desired. In one case the pre-sampling filter took the form of a small high performance low-pass sampling filter approximating a six pole Butterworth amplitude characteristic.

FIGS. 1 through 3 have been described to illustrate the advantages of capacitive feedback type charge transfer in various multiplexer arrangements. However, as pointed out above, in each case the input node of the charge transfer amplifier is a virtual ground because of feedback around the amplifier, so that the output voltage at terminals 36 and 38 represents the integrated value of the input currents to this node. Since the output of the charge transfer amplifier is reduced to zero immediately before each new sample is taken by shorting switch 19, only the amount of current integrated between the end of the zeroing operation and the time the output is used or sampled is of importance. However, extraneous coupling may be caused by leakage conduction through the switches by AC coupling through stray capacity across the terminals of the sampling switches or charges on shunt capacity in the switches and this extraneous coupling may introduce, in certain instances, undesirable error. For this reason, each of the circuits of the FIG. 1–3 may be improved by the novel balanced charge transfer circuit described below.

Although the novel transfer circuit of the present invention is usable with both grounded and floating inputs, the problem of stray capacity and its novel solution by the present invention may be best illustrated by a consideration of the floating input circuit of FIG. 4. This circuit is similar to that of FIG. 1 but in FIG. 4 the analog source 32 having a voltage $e_i$ and an internal resistance 34 is floating, i.e., it is not grounded except through the common mode resistor 50 and generator 48. Thus, the analog source itself may be at some potential with respect to the system or circuit ground and this is indicated by the additional generator 48 having an internal resistance 50, both of which are illustrated in dashed lines in FIG. 4. In this arrangement, certain common mode characteristics can be achieved and some of the effects of stray capacitance eliminated by providing a pair of resistors 56 and 58 connected to the input terminals 24 and 26 and each of a value equal to $R_M/2$. The stray capacities of the double pole switch 20 are illustrated by the dashed lines at $C_s$ and $C_s'$. Using a double pole switch in the manner shown in FIG. 4 provides a degree of freedom with respect to common mode voltages. Since sampling capacitor $C_M$ is essentially ungrounded it charges to the floating input voltage $e_i$ and not to $e_c$. The principal limitation in practice with the circuit of FIG. 4 and the stray capacities $C_s$ and $C_s'$ in the sampling switch, is that while $C_s'$ discharges into the system ground, $C_s$ discharges into capacitor 18 when the sampling switch 20 is closed.

Where it is necessary to obtain very high common mode rejection, a modification of the circuit of FIG. 4 may be employed and this modified arrangement is shown in FIG. 5. In this embodiment a second amplifier 12' is provided identical with the amplifier 12 and including the feedback capacitor 18' and shorting switch 19', the latter ganged with shorting switch 19. Also provided is an output capacitor 60 and a pair of double pole output switches 62 and 64. The common mode rejection of the circuit of FIG. 5 can be shown to depend upon the degree of unbalance in the stray capacities, i.e., the difference between $C_s$ and $C_s'$ (instead of their magnitudes) assuming equal voltage gain in the two amplifiers 12 and 12'. Thus, an improvement of an order of magnitude over the circuit of FIG. 4 is obtained, and if desired it can be made to approach infinite rejection by trimming the stray capacities in the sampling switch circuit.

Figures 6, 7, 8:
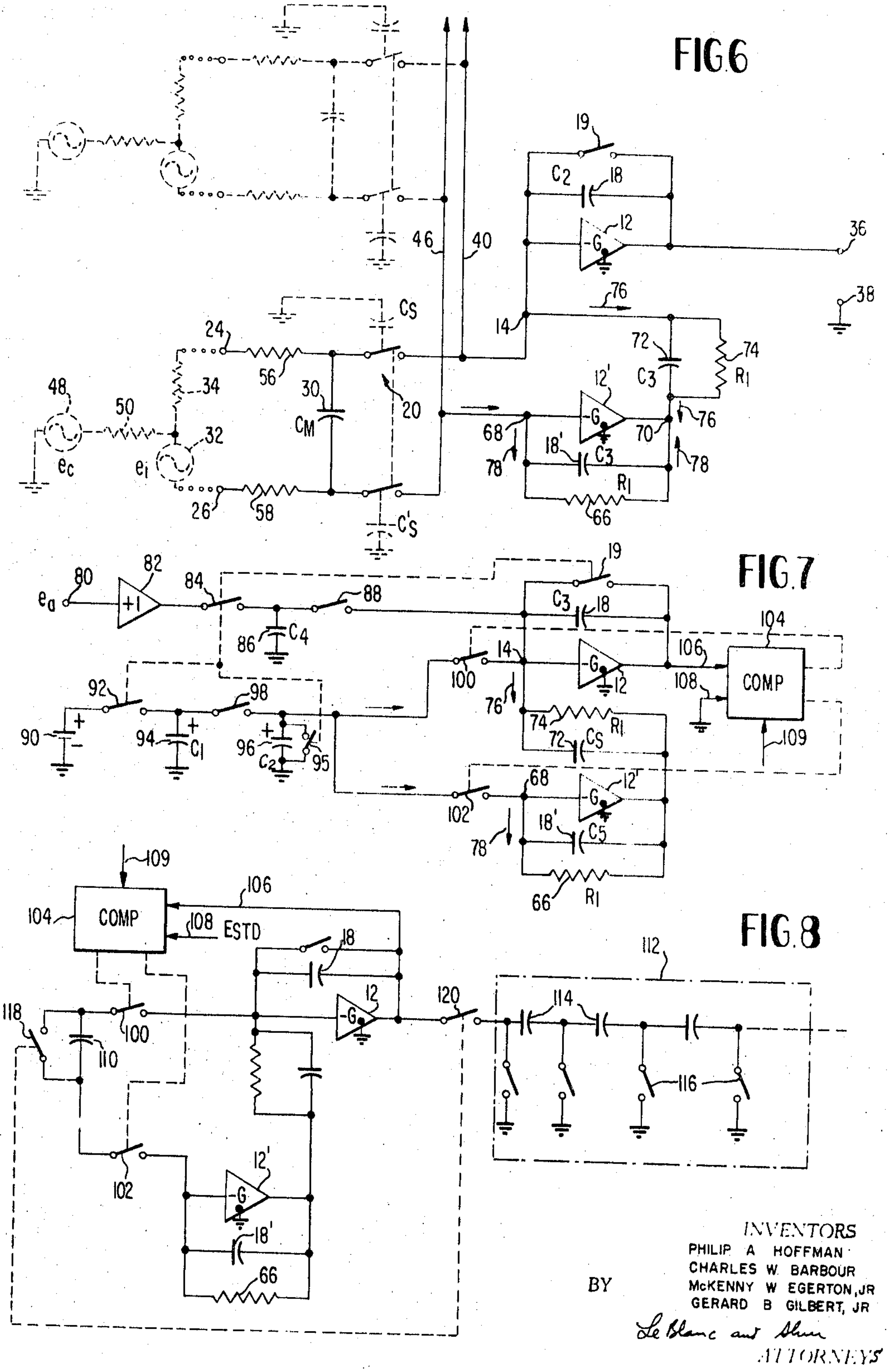
FIG. 6 is a circuit diagram of a preferred balanced charge transfer circuit constructed in accordance with the present invention.
FIG. 7 is a circuit diagram of an analog to digital converter utilizing the balance circuit of FIG. 6.
FIG. 8 is a circuit diagram of a logarithmic analog to digital converter utilizing the balanced charge transfer circuit of FIG. 6.

Although the circuit of FIG. 5 may be used to obtain very high common mode rejection, FIG. 6 shows a preferred embodiment of the novel balanced charge transfer circuit of this invention. The circuit of this invention. The circuit of FIG. 6 preserves all the advantages of the high mode rejection of the FIG. 5 circuit but at the same time is much simpler and more inexpensive to construct in that it eliminates the output switches 62 and 64 of the circuit of FIG. 5 and only requires the addition of a pair of relatively inexpensive resistors. As before, like parts bear like reference numerals in FIG. 6.

In FIG. 6 the sampling capacitor 30 is adapted to be connected to a sampling source in the manner illustrated in FIG. 5, and connections to additional sources for multiplex operation may likewise be provided as described above by way of the additional leads 40 and 46. In this circuit a second amplifier 12' identical with the amplifier 12 is also provided and includes a feedback capacitor 18' labeled $C_3$. However, in place of the shorting switch 19' a resistor 66 labeled $R_1$ is connected across capacitor 18' from the input terminal or node 68 to the output node 70 of the second amplifier. An additional parallel RC circuit consisting of capacitor 72 (equal in capacitance to capacitor 18') and a resistor 74 (equal in resistance to resistor 66) is connected between the input node 14 of amplifier 12 and the output terminal 70 of the second amplifier 12'.

The operation of the preferred circuit of FIG. 6 is as follows: As previously indicated, since the source 32 is illustrated as a floating source, the sampling capacitor $C_M$ will charge to the voltage $e_i$. However, each of the stray capacities $C_s$ and $C_s'$ will charge to a voltage representative of the difference between the floating source and ground which difference is illustrated in FIG. 6 by the second source 48. That is, the stray capacities will charge to the potentials $e_c$ and $e_c-e_i$. The function of the circuit of FIG. 6 is to produce an output across output terminals 36 and 38 proportional to $e_i$. The circuit is such that the output is proportional to the difference between $C_s$ and $C_s'$ rather than proportional to the magnitude of one or both of these stray capacitances. For the sake of this discussion, it will be assumed that switch 20 is perfectly symmetrical and that stray capacity $C_s$ equals stray capacity $C_s'$ and it will be further assumed that both the potentials $e_c$ and $e_i$ are positive with $e_c>e_i$.

Since both input nodes 14 and 68 are held at virtual circuit or system ground by the feedback action of the amplifiers 12 and 12', when switch 20 is closed both sides of capacitor 30 are connected to virtual ground and the capacitor will discharge. Assuming that the upper plate of capacitor 30 in FIG. 6 was initially at a positive potential, the capacitor will discharge into node 14 and the discharging current is integrated on capacitor 18 with an opposite polarity, i.e., if the upper plate of capacitor 30 was positive then the voltage at the output terminal 36 will be negative. However, it is apparent that the stray capacity $C_s$ previously charged to the positive potential $e_c$ also discharge into node 14 and that this discharging current will also be integrated across capacitor 18 and tend to appear as a negative increment of error voltage at the output terminal 36.

The above-described negative increment of error voltage at output terminal 36 is eliminated in the circuit of FIG. 6 by means of the discharge of stray capacity $C_s'$ into node 68, this latter stray capacity having been charged to the potential $e_c-e_i$ and assumed to be of equal capacitance to stray capacity $C_s$ otherwise causing the error. This error cancellation may be understood as follows: The discharge of the positive side of stray capacity $C_s'$ into node 68 tends to produce a corresponding negative potential at the output node 70 and since input node 68 is maintained by feedback at the circuit or system ground, then output node 70 tends to be driven negative with respect to ground. However, node 70 is connected by way of capacitor 72 and resistor 74 to the virtual ground potential of input node 14 of amplifier 12 and since a potential difference exists across these two impedances, current flows through them in the direction of the arrows 76 in FIG. 6 in accordance with Ohms law. In other words, the discharge of capacitances $C_s'$ and $C_M$ into node 68 causes a current to flow around amplifier 12' through capacitor 18' and resistor 66 in a manner similar to the action of an operational amplifier. This current is indicated by the arrows 78. However, at the same time, a current 76 flows through capacitor 72 and resistor 74 from the virtual ground node 14 to the negative node 70. If the time constant of capacitor 72 and resistor 74 is equal to the time constant of capacitor 18' and resistor 66 then currents 76 and 78 are proportional to each other.

The overall result of the above is that the error caused by the discharge of stray capacity $C_s$ discharging into the node 14 is counteracted by the current flow from stray capacity $C_s'$ into node 68, this latter capacity causing current 76 to flow out of the node 14 and since the capacities and resistors are equal the total amount of charge flowing in the example above into node 14 due to $e_c$ from stray capacity $C_s$ is equal to the amount of charge due to $e_c$ flowing out of the node 14 by way of current 76. Therefore, the output potential at output terminal 36 is truly representative of the initial charge on capacitor 30 and is independent of the common mode charges on stray capacities $C_s$ and $C_s'$, the currents of which cancel each other out at input terminal 14.

Currents 76 and 78 are equal if the two RC time constants are equal, that is $R_{66}C_{18'}=R_{74}C_{72}$ and if $C_{18'}=C_{72}$. This of course may be accomplished by making both resistors and both capacitors equal. However, if stray capacitance $C_s$ is not equal to stray capacitance $C_s'$ then the resistors and capacitors are not equal but rather the values of resistor 74 and capacitor 72 are varied to compensate for the unequal stray capacitances.

Upon initial closure of switch 20 the initial flow of current 78 caused by stray capacity $C_s'$ is through capacitor 18', node 70 and to the internal ground terminal of the amplifier. This is similar to the current flow through capacitor 18 around amplifier 12. However, as soon as charge collects on capacitor 18' node 70 is driven negative (for the positive input assumed) and current 76 begins to flow from node 14 to negative node 70. Also as capacitor 18' develops a charge some of the current 76 flows through resistor 66 and likewise as soon as capacitor 72 develops a charge some of the current 76 flows through resistor 74. Resistors 74 and 66 provide discharge paths for capacitors 72 and 18' respectively.

The above has assumed positive polarities for the potentials $e_c$ and $e_i$. It is apparent, however, that the circuit operates in a similar manner for a different polarity across capacitor $C_M$ and for a negative $e_c$ rather than a positive $e_c$. It is believed that the operation of the circuit for these other conditions is apparent from the above description and the overall result is an output at terminal 36 which is of opposite polarity to the initial potential across capacitor 30, is proportional in magnitude to that potential, and carries an error signal due to common mode representative primarily of only the difference in magnitude between the two capacities $C_s$ and $C_s'$.

FIG. 7 is a block diagram of a reversible analog to digital converter of the type disclosed in U.S. Patent 3,098,224 incorporating the novel balanced charge transfer circuit of FIG. 6. The A/D converter of FIG. 7 includes an analog input terminal 80 coupled through a unity gain amplifier 82 and switch 84 to a sample and hold capacitor 86. This capacitor is coupled by way of switch 88 to the input node 14 of amplifier 12.

Also provided is a source of reference potential illustrated by the battery 90 coupled by way of switch 92 to the first of a pair of equal charge sharing capacitors 94 and 96 labeled $C_1$ and $C_2$. A switch 98 couples the two charge sharing capacitors together, while a pair of switches 100 and 102 couple the capacitor to one of the amplifiers 12 or 12'. Switches 100 and 102 are operated alternatively under the control of a comparator 104 having a first input 106 connected to the output of amplifier 12 and a second input 108 connected to a reference potential, in this case ground. In operation, with capacitor 96 ($C_2$) initially discharged by shorting switch 95 the simultaneous closure of ganged switch 92 at the beginning of an encoding period places a reference charge on capacitor 94 from battery 90. The closure of switch 84 which is ganged with switches 92 and 95 places a sample of the analog voltage at terminal 80 on capacitor 86 and the simultaneous closure of switch 19 ganged with the aforementioned three switches, acts to discharge capacitor 18 to zero potential.

Subsequent closure of switch 88 causes capacitor 86 to discharge into virtual ground node 14 so that the charge on capacitor 86 representative of the analog input now appears across capacitor 18 but with an opposite polarity. A comparison is made in comparator 104 between this potential and ground and if the potential at lead 106 is positive one of the switches 100 or 102 is operated and if negative the other switch is operated. However, prior to this comparison and switch operation, switch 98 is operated so that half of the charge on capacitor 94 is transferred to capacitor 96 so that the closure of either switch 100 or 102 causes capacitor 96 to discharge either into amplifier 12 or amplifier 12'.

The operation of the converter of FIG. 7 may be best understood by an illustrative example. The overall function of the circuit is to reduce the potential across capacitor 18 and hence the potential on lead 106 in successive binarily related decreasing increments towards zero. The binary output of the circuit which is a digital representation of the value of the analog input may be taken from the successive pulsing of either the switch 100 or the switch 102. A more detailed description of the successive approximation mode of operation is given in the aforementioned U.S. Patent 3,098,224.

Assume by way of example only that the analog input to terminal 80 is negative. Because of the inverter action of amplifier 12 the analog sample across capacitor 86 will appear as a positive potential at terminal 106 to the input of the comparator. A comparison is made with ground in the comparator and the fact that the input 106 is positive causes an output pulse from the comparator (which may form a portion of the digital output train) to close switch 100. Assuming the polarities for the battery 90 and for the resulting charge on capacitors 94 and 96 as illustrated, the closure of switch 100 causes capacitor 96 to discharge into node 14 and this positive current flow tends to drive the terminal 106 more negative, i.e., reducing the positive potential previously appearing thereon towards zero. A subsequent closure of switch 98 transfers half as much charge to capacitor 96 and if the comparator input terminal 106 is still positive switch 100 is again closed. However, if the initial closure of switch 100 drove terminal 106 negative, then the comparison in comparator 104 will now result in an output pulse from the comparator actuating switch 102. In this event, capacitor 96 is discharged into node 68, rather than node 14. However, as pointed out, in conjunction with the description of FIG. 6, the discharge of a positive side of a capacitor into the node 68 causes a corresponding current 76 to flow out of node 14, so that the effect on the lead 106 is to drive the lead more positive. In other words, the application of a positive discharge to node 68 is equivalent to a negative discharge into node 14 with the important exception that the balanced arrangement of FIG. 7 eliminates any adverse effect of stray capacity just as it did in the embodiment of FIG. 6. In this case, the effect of stray capacity is more likely to result from leakage currents through the switches 100 and 102 which may be substantial. This is so even though one side of the FIG. 7 input is grounded rather than floating as is the input of FIG. 6.

For digital to analog operation in FIG. 7 the digital input train is applied to comparator input lead 109 to control the closing sequence of switches 100 and 102 and the analog output is the voltage built up across capacitor 18 and appearing on lead 106. The comparator is of course disconnected from lead 106 by a suitable switch.

FIG. 8 with like parts again bearing like reference numerals illustrates the novel balanced charge transfer circuit of FIG. 6 incorporated in a logarithmic converter of the type illustrated in copending application Serial No. 280,624, filed May 15, 1963. Reference may be had to that application for a detailed description of the theory and mode of operation of the logarithmic converter. The overall function of the logarithmic converter is to generate a digital output (in the case of A/D conversion) which is representative of the logarithm of the analog input. When operated as a D/A converter the analog output conversely represents the antilog of the digital input.

Briefly, a standard signal chosen in accordance with the logic set out in the aforementioned copending application is applied to comparator 104 and is periodically compared with the output potential from amplifier 12 supplied to the other lead 106 of the comparator. Depending upon the comparison, i.e., whether the potential on lead 106 is positive or negative with respect to the standard potential at lead 108, either switch 100 or 102 is operated to modify the potential on capacitor 18 in a logarithmic manner. The output of amplifier 12 is coupled through an attenuator 112 including a plurality of series capacitors 114 shunted by switches 116. Depending upon which particular switch 116 is actuated, one or more of the capacitors 114 may be operative in the circuit. Shorting switch 118 across capacitor 110 is ganged with switch 120, so that when the attenuator is coupled in the circuit, capacitor 110 is shorted. Again, the impulsing of either switch 100 or switch 102 may be taken as the digital output of the converter which output will be representative of the logarithm of the analog input. The analog input is preferably supplied to capacitor 18 in FIG. 8 in exactly the same manner it is supplied to this capacitor in the embodiment of FIG. 7, i.e., by way of a sample and hold circuit such as is illustrated in FIG. 7. As before for D/A conversion the input is applied at comparator lead 109 and the analog output appears on lead 106 which for D/A conversion is disconnected from the comparator.

It is apparent from the above that the present invention provides a novel balanced charge transfer circuit having substantially increased common mode rejection which is useful in multiplexing for eliminating errors caused by stray capacitance acting upon the input node of the charge transfer circuit. The novel balanced circuit has been described in conjunction with both sequential and simultaneous multiplexing, involving either grounded or floating inputs, in conjunction with a charge transfer type reversible analog to digital converter and also in conjunction with a reversible logarithmic converter. An important feature of the present invention includes the provision of a second amplifier and in the preferred embodiment this amplifier is connected with both a capacitor and a resistor in its feedback circuit and with its output coupled to the input of the other amplifier. In this way, the transfer of charge of one polarity through the input node of the second amplifier, has the same effect as the transfer of charge of an opposite polarity to the input node of the first amplifier, but with the important exception that the transfer of charge with the same polarity into both nodes is cancelled out. This latter balanced cancellation is effective to eliminate the effects of stray capacitance at the input terminals of the two amplifiers.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A balanced charge transfer circuit comprising a pair of input terminals and an output terminal, a first charge transfer amplifier having a feedback capacitor, said first amplifier being continuously coupled between one of said input terminals and said output terminal, a second charge transfer amplifier having its input continuously coupled to the other of said input terminals and having a feedback capacitor and resistor connected in parallel, and a parallel resistor and capacitor continuously coupling the output of said second amplifier to the input of said first amplifier.

2. A circuit according to claim 1 wherein both of said resistors are equal.

3. A multiplexer comprising a charge transfer circuit having a pair of input terminals and an output terminal, a plurality of switch means for coupling a plurality of charge sources to said input terminals, a first amplifier having a feedback capacitor, said first amplifier being continuously coupled between one of said input terminals and said output terminal, a second amplifier having its input continuously coupled to the other of said input terminals and having a feedback capacitor and resistor connected in parallel, and a parallel resistor and capacitor continuously coupling the output of said second amplifier to the input of said first amplifier.

4. A multiplexer according to claim 3 wherein said charge sources comprise capacitive portions of low pass filters coupled to the inputs of said plurality of switch means.

5. A multiplexer according to claim 4 including a plurality of analog sources to be sampled, and a shunt sampling capacitor and series resistor coupling each of said sources to one of said switch means.

6. An analog to digital converter comprising means for generating binarily decreasing increments of charge, a charge transfer circuit having a pair of input terminals and an output terminal, first switch means for coupling said charge generator to one of said input terminals, second switch means for coupling said charge generator to the other of said input terminals, a comparator having a pair of inputs and a pair of outputs, one of said comparator outputs constituting the digital output for said converter, said comparator outputs being coupled to said first and second switch means for selectively closing said first and second switch means, means for coupling one of said comparator inputs to a reference signal, means coupling the other of said comparator inputs to said charge transfer circuit output terminal, a first charge transfer amplifier having a feedback capacitor, said first amplifier being continuously coupled between one of said input terminals and said output terminal, a second charge transfer amplifier having its input continuously coupled to the other of said input terminals and having a feedback capacitor and resistor connected in parallel, and a parallel resistor and capacitor continuously coupling the output of said second amplifier to the input of said first amplifier.

7. A converter according to claim 6 including means for initially placing a sample of an analog input signal on said feedback capacitor of said first amplifier.

8. A converter according to claim 6 wherein said charge generator comprises a pair of equal charge sharing capacitors, and switch mans for periodically coupling said sharing capacitors together in charge sharing relation.

9. A converter according to claim 6 wherein said comparator is provided with a digital input for digital to analog conversion.

10. A logarithmic analog to digital converter comprising a charge modifying capacitor, a charge transfer circuit having a pair of input terminals and an output terminal, first switch means for coupling said charge modifying capacitor to one of said input terminals, second switch means for coupling said charge modifying capacitor to the other of said input terminals, a comparator having a pair of inputs and a pair of outputs, one of said comparator outputs constituting the digital output for said converter, said comparator outputs being coupled to said first and second switch means to selectively close said first and second switch means, mean for coupling one of said comparator inputs to a reference signal, means coupling the other of said comparator inputs to said charge transfer circuit output terminal, an attenuator coupled to said charge transfer circuit output terminal, a first charge transfer amplifier having a feedback capacitor, said first amplifier being continuously coupled between one of said input terminals and said output terminal, a second charge transfer amplifier having its input continuously coupled to the other of said input terminals and having a feedback capacitor and resistor connected in parallel, and a parallel resistor and capacitor continuously coupling the output of said second amplifier to the input of said first amplifier.

11. A logarithmic converter according to claim 10 wherein said first and second switch means couple said input terminals to the opposite sides of said charge modifying capacitor.

12. A logarithmic converter according to claim 11 wherein said attenuator comprises a plurality of series capacitors separated by grounded shunting switches, third switch means for coupling said output terminal to said attenuator, fourth switch means for shorting said charge modifying capacitor, and means ganging said third and fourth switch means.

13. A logarithmic converter according to claim 11 including means for initially placing a sample of an analog input signal on said feedback capacitor of said first amplifier.

14. A logarithmic converter according to claim 11 wherein said comparator is provided with a digital input for digital to analog conversion.

References Cited

UNITED STATES PATENTS

| | | | |
|---|---|---|---|
| 3,251,052 | 5/1966 | Hoffman et al. | 340—347 |
| 3,271,651 | 9/1966 | Diederich | 320—1 |
| 3,314,062 | 4/1967 | Pommerening | 340—347 |

MAYNARD R. WILBUR, Primary Examiner

M. K. WOLENSKY, Assistant Examiner

U.S. Cl. X.R.

179—15; 307—109; 320—1